US012268030B2

(12) United States Patent
Xie et al.

(10) Patent No.: US 12,268,030 B2
(45) Date of Patent: Apr. 1, 2025

(54) SELF-ALIGNED C-SHAPED VERTICAL FIELD EFFECT TRANSISTOR

(71) Applicant: International Business Machines Corporation, Armonk, NY (US)

(72) Inventors: Ruilong Xie, Niskayuna, NY (US); Robert Robison, Rexford, NY (US); Hemanth Jagannathan, Niskayuna, NY (US); Jay William Strane, Warwick, NY (US)

(73) Assignee: International Business Machines Corporation, Armonk, NY (US)

( * ) Notice: Subject to any disclaimer, the term of this patent is extended or adjusted under 35 U.S.C. 154(b) by 693 days.

(21) Appl. No.: 17/446,784

(22) Filed: Sep. 2, 2021

(65) Prior Publication Data

US 2023/0067119 A1    Mar. 2, 2023

(51) Int. Cl.
| | | |
|---|---|---|
| H01L 29/66 | (2006.01) | |
| H10D 30/01 | (2025.01) | |
| H10D 30/62 | (2025.01) | |
| H10D 30/63 | (2025.01) | |
| H10D 84/01 | (2025.01) | |
| H10D 84/03 | (2025.01) | |
| H10D 84/83 | (2025.01) | |

(52) U.S. Cl.
CPC ......... *H10D 84/834* (2025.01); *H10D 30/025* (2025.01); *H10D 30/6219* (2025.01); *H10D 30/63* (2025.01); *H10D 84/0193* (2025.01); *H10D 84/038* (2025.01)

(58) Field of Classification Search
CPC ......... H01L 29/0657; H01L 21/823821; H01L 29/41791; H01L 29/66666
See application file for complete search history.

(56) References Cited

U.S. PATENT DOCUMENTS

| | | | |
|---|---|---|---|
| 7,265,041 B2 | 9/2007 | Wu | |
| 8,956,932 B2 | 2/2015 | Cheng | |
| 9,048,329 B2 | 6/2015 | Kim | |
| 9,391,073 B2 | 7/2016 | Yin | |
| 9,496,259 B2 | 11/2016 | Chien | |

(Continued)

FOREIGN PATENT DOCUMENTS

| | | |
|---|---|---|
| CN | 112103247 A | 12/2020 |
| WO | 2023030226 A1 | 3/2023 |

OTHER PUBLICATIONS

Notification of Transmittal of The International Search Report and The Written Opinion of the International Searching Authority, or the Declaration, International Application No. PCT/CN2022/115436, Nov. 30, 2022, 10 pgs.

*Primary Examiner* — Vu A Vu
*Assistant Examiner* — Valerie N Newton
(74) *Attorney, Agent, or Firm* — Michael A. Petrocelli

(57) ABSTRACT

A self-aligned C-shaped vertical field effect transistor includes a semiconductor substrate having an uppermost surface and a fin structure on the uppermost surface of the semiconductor substrate. The fin structure has two adjacent vertical segments with rounded ends that extend perpendicularly from the uppermost surface of the semiconductor substrate and a horizontal segment that extends between and connects the two adjacent vertical segments. An opening is located between the two adjacent vertical segments on a side of the fin structure opposite to the horizontal segment.

20 Claims, 10 Drawing Sheets

(56) References Cited

U.S. PATENT DOCUMENTS

| | | | |
|---|---|---|---|
| 9,748,244 | B2 | 8/2017 | Masuoka |
| 10,170,473 | B1 | 1/2019 | Zang et al. |
| 10,263,296 | B2 | 4/2019 | Suzuki |
| 10,340,364 | B2 | 7/2019 | Zhang |
| 10,418,484 | B1 | 9/2019 | Ruilong |
| 2016/0056295 | A1 | 2/2016 | Wen et al. |
| 2017/0098709 | A1* | 4/2017 | Dias .................... H03D 7/1441 |
| 2018/0277682 | A1 | 9/2018 | Zhu |
| 2019/0198502 | A1 | 6/2019 | Huang |
| 2020/0403086 | A1* | 12/2020 | Kim .................. H10D 30/6213 |
| 2021/0057568 | A1 | 2/2021 | Xie et al. |
| 2021/0183902 | A1 | 6/2021 | Ishizaki |

\* cited by examiner

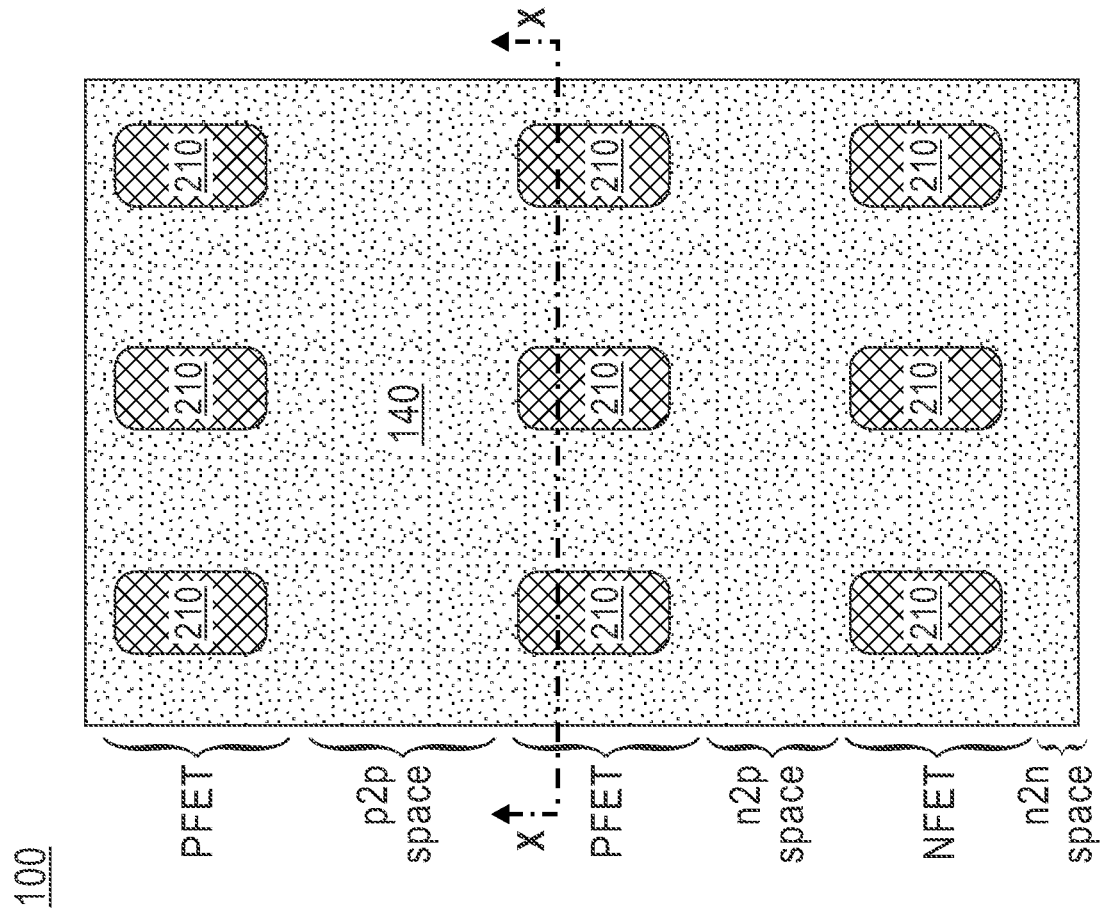
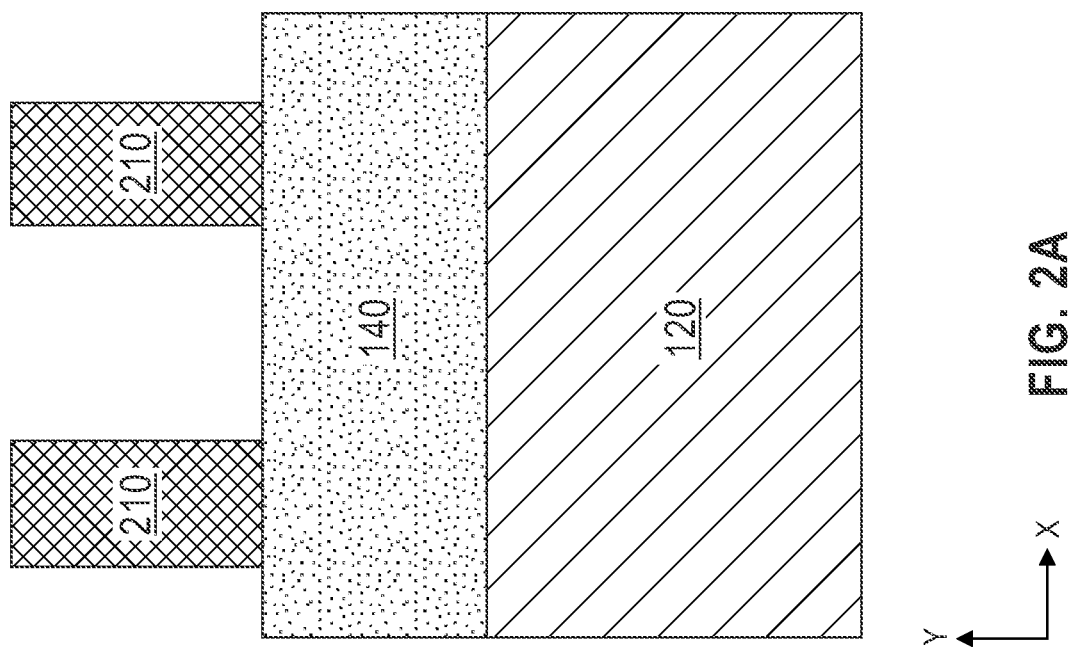
FIG. 2B
FIG. 2A

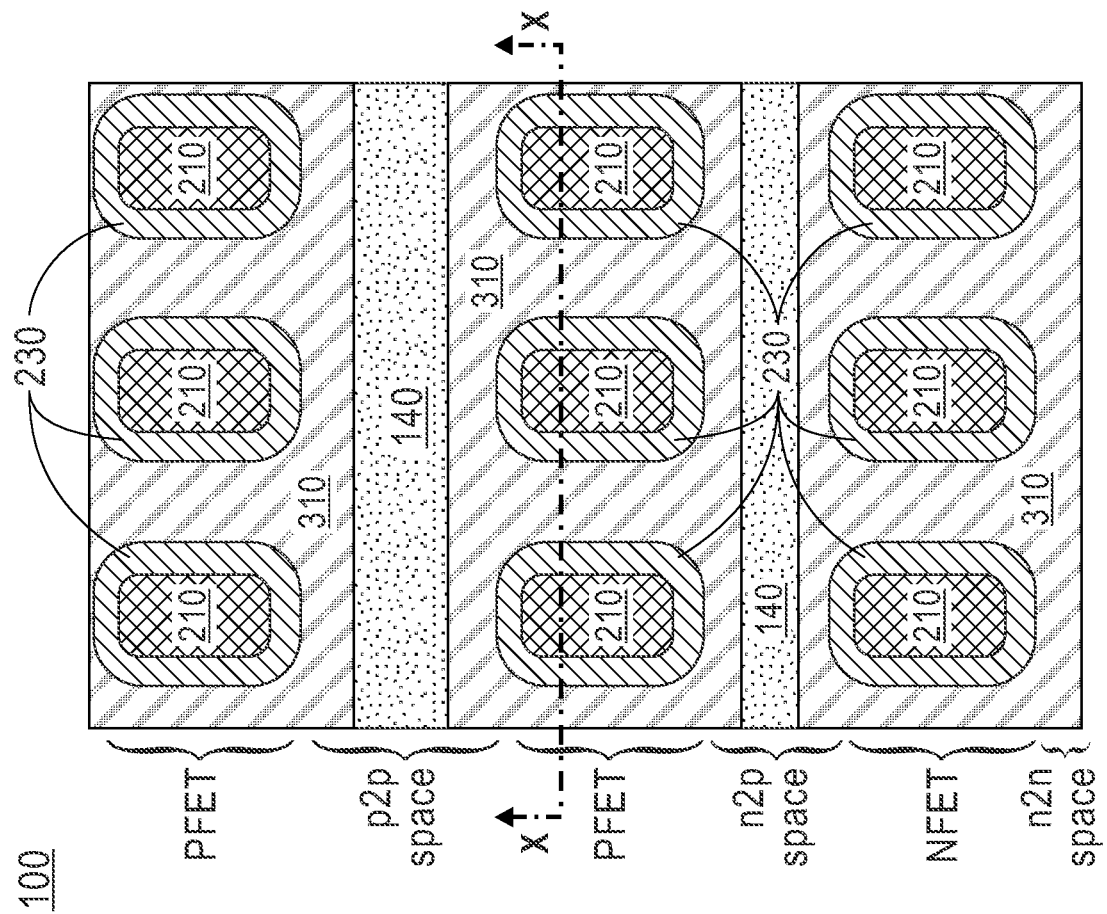
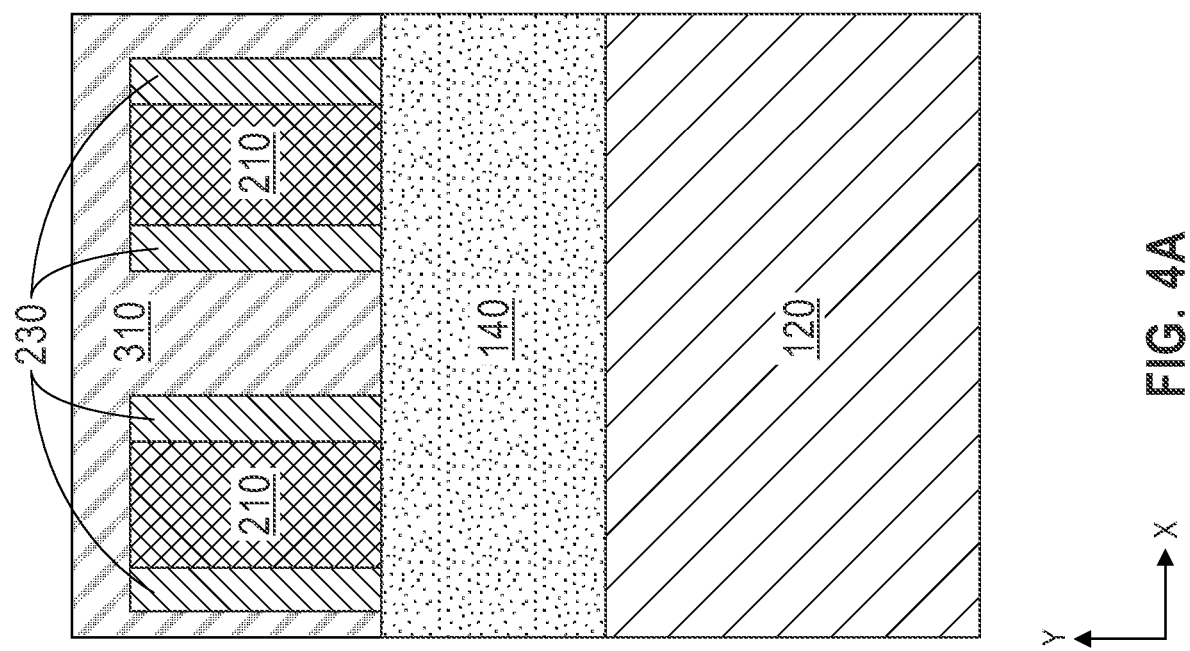

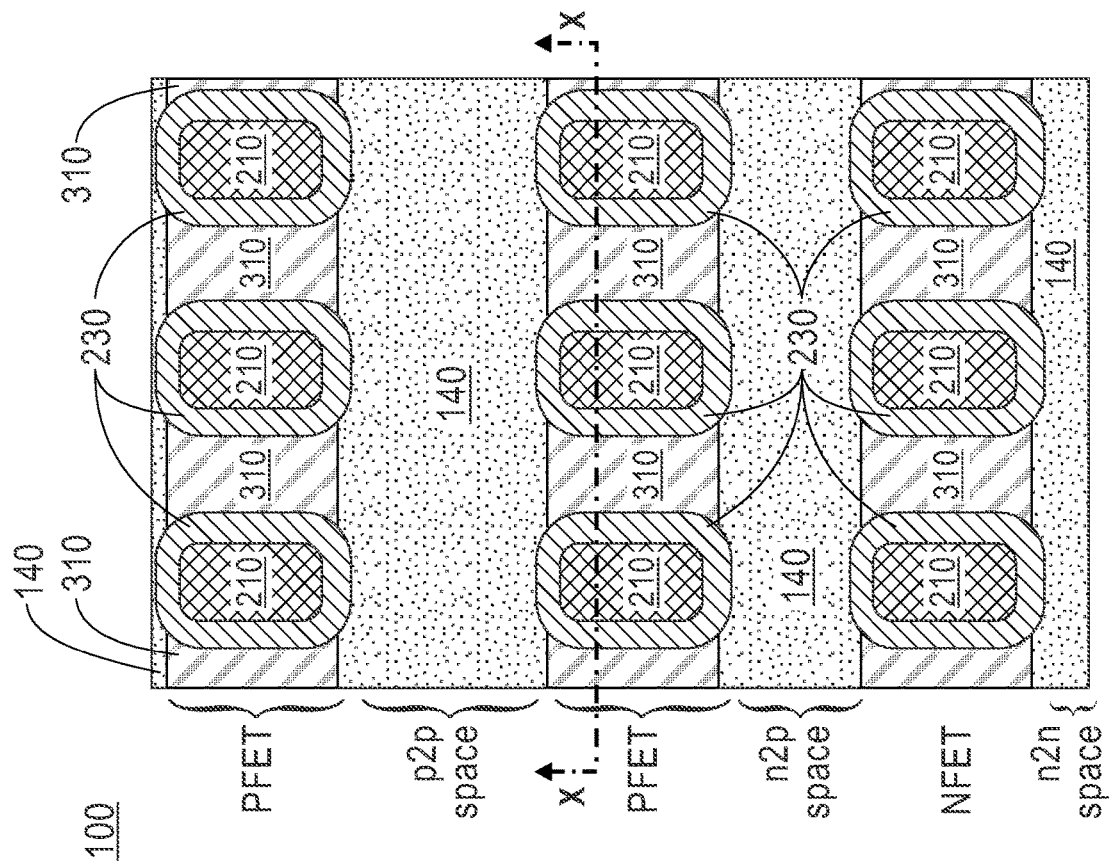
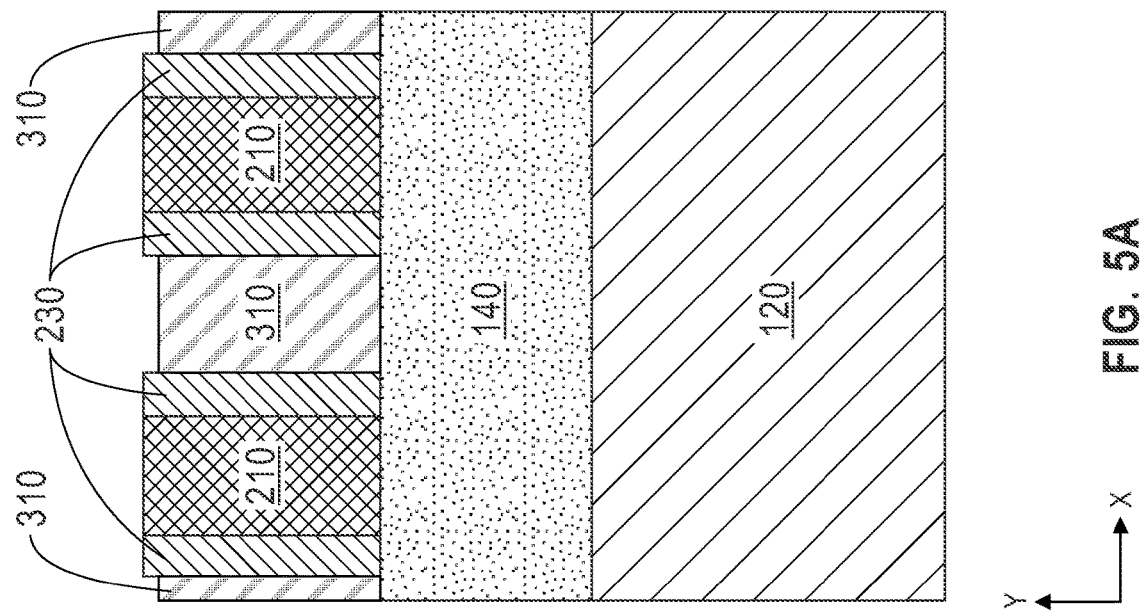
FIG. 5A
FIG. 5B

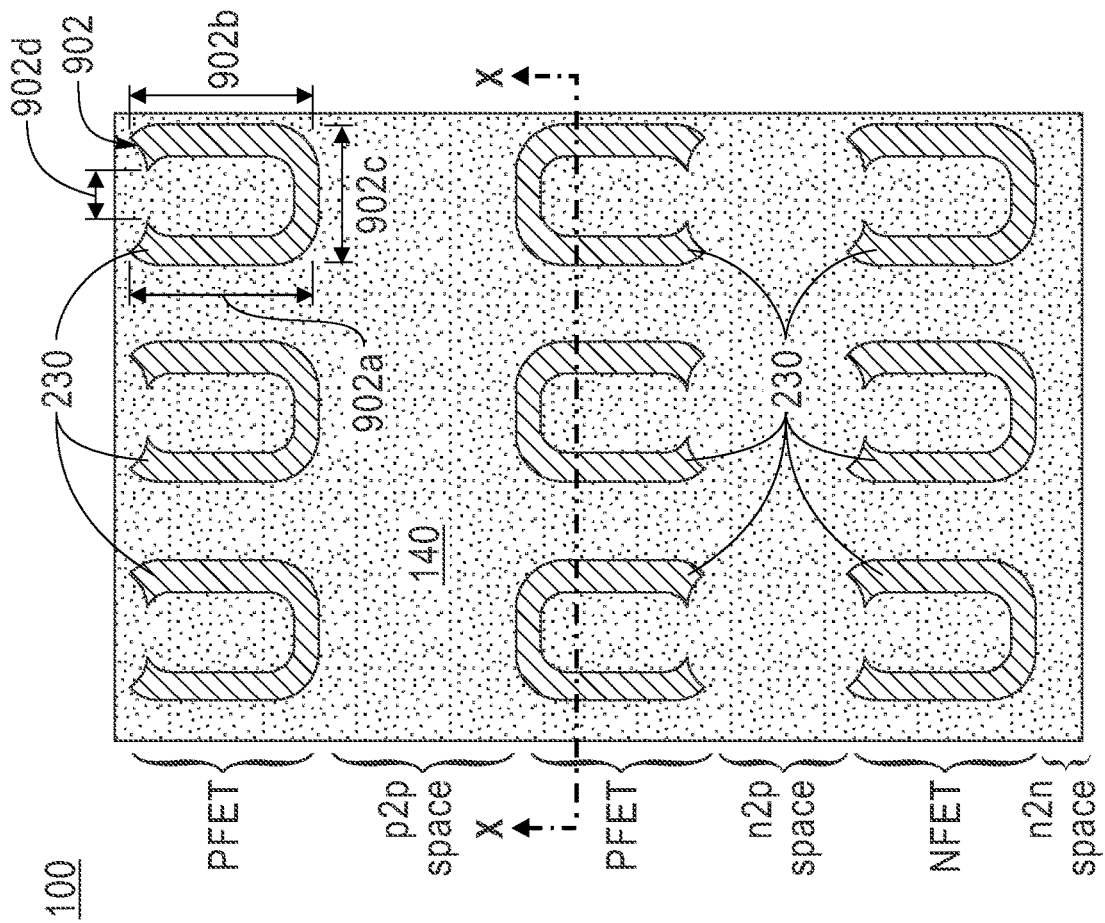
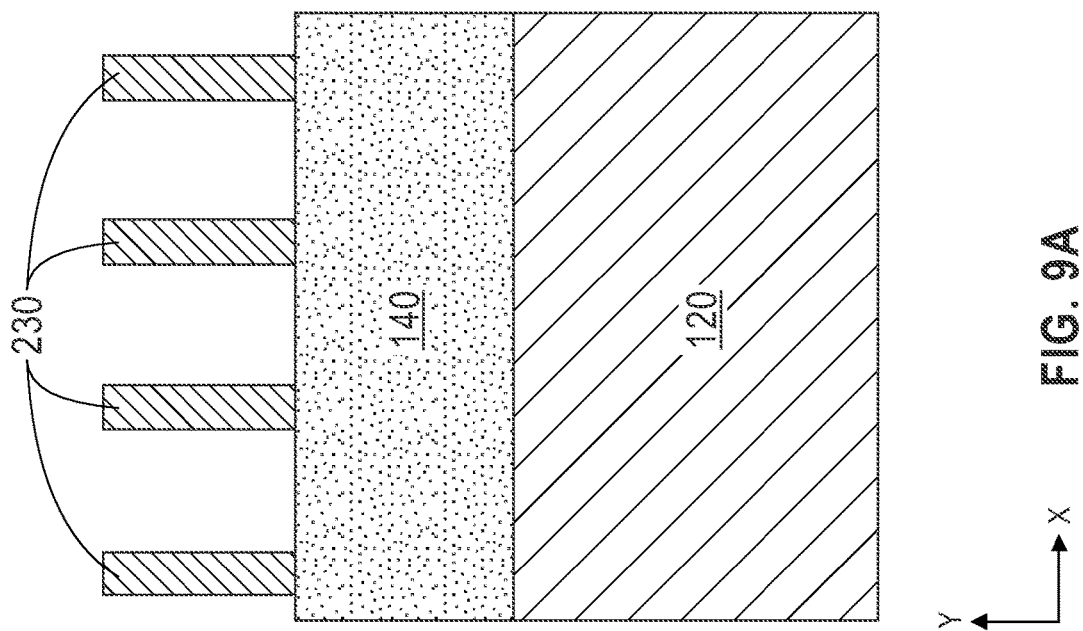
FIG. 9B
FIG. 9A

SELF-ALIGNED C-SHAPED VERTICAL FIELD EFFECT TRANSISTOR

BACKGROUND

The present invention generally relates to the field of semiconductor devices, and more particularly to fabricating vertical field-effect transistors (VFETs).

VFETs have been pursued as a potential device option for scaling complementary metal-oxide semiconductors (CMOS) to the 5 nanometer (nm) node and beyond. As opposed to planar CMOS devices, VFETs are oriented vertically with a vertical fin or nanowire that extends upward from the substrate. The fin or nanowire forms the channel region of the transistor. A source region and a drain region are situated in electrical contact with the top and bottom ends of the channel region, while the gate is disposed on one or more of the fin or nanowire sidewalls. Thus, in VFETs the direction of the current flow between the source and drain regions is normal to the main surface of the substrate.

Advantages of VFETs architecture include improved electrostatics and the ability to increase the amount of effective width ($W_{eff}$) available in a given device footprint. Continued scaling of fin dimensions for $W_{eff}$ improvement may present numerous challenges due to a combination of quantum effects, patterning process realities and contact architecture limitations. More specifically, since the channel width of a VFET corresponds to the length of the fin (or nanowire), the fins must be sufficiently long to achieve the desired device drive current. As a result, VFET cell size scaling and, particularly, VFET cell height scaling is limited. Additional limitations on VFET cell size scaling include, but are not limited to, critical design rules (e.g., minimum gate contact to fin distance, etc.).

SUMMARY

Therefore, there is a need for improved designs and techniques for fabricating VFET devices having C-shaped fin structures that can facilitate cell-height scaling (i.e., flexible design) without affecting device performance or violating design rules.

According to an embodiment of the present disclosure, a semiconductor structure includes a semiconductor substrate having an uppermost surface, and a fin structure on the uppermost surface of the semiconductor substrate, the fin structure including two adjacent vertical segments with rounded ends extending perpendicularly from the uppermost surface of the semiconductor substrate and a horizontal segment extending between and connecting the two adjacent vertical segments, an opening is located between the two adjacent vertical segments on a side of the fin structure opposing the horizontal segment.

According to another embodiment of the present disclosure, a semiconductor structure includes a semiconductor substrate, a first region and a second region on the semiconductor substrate, the first region being adjacent to the second region and separated from the second region by a first space, the first region and the second region having a first polarity, a third region on the semiconductor substrate adjacent to the second region and separated from the second region by a second space, the third region having a second polarity that is different from the first polarity, and a row of fin structures disposed on each of the first region, the second region and the third region, each fin structure in the row of fin structures including two adjacent vertical segments with rounded ends extending perpendicularly from an uppermost surface of the semiconductor substrate and a horizontal segment extending between and connecting the two adjacent vertical segments, wherein an opening is located between the two adjacent vertical segments on a side of the fin structure opposing the horizontal segment.

According to yet another embodiment of the present disclosure, a method of forming a semiconductor structure includes forming a plurality of fin structures on an uppermost surface of a semiconductor substrate, each fin structure in the plurality of fin structures including two adjacent vertical segments with rounded ends extending perpendicularly from the uppermost surface of the semiconductor substrate, and a horizontal segment extending between and connecting the two adjacent vertical segments, wherein an opening is located between the two adjacent vertical segments on a side of each fin structure opposing the horizontal segment.

BRIEF DESCRIPTION OF THE DRAWINGS

The following detailed description, given by way of example and not intended to limit the invention solely thereto, will best be appreciated in conjunction with the accompanying drawings, in which:

FIG. 2A is a cross-sectional view of the semiconductor structure taken along line X-X after forming an array of mandrels, according to an embodiment of the present disclosure;

FIG. 2B is a top-down view of the semiconductor structure;

FIG. 4A is a cross-sectional view of the semiconductor structure taken along line X-X after depositing an oxide layer, according to an embodiment of the present disclosure;

FIG. 4B is a top-down view of the semiconductor structure;

FIG. 5A is a cross-sectional view of the semiconductor structure taken along line X-X after patterning of the oxide layer, according to an embodiment of the present disclosure;

FIG. 5B is a top-down view of the semiconductor structure;

FIG. 9A is a cross-sectional view of the semiconductor structure taken along line X-X after removing the array of mandrels and the oxide layer, according to an embodiment of the present disclosure;

FIG. 9B is a top-down view of the semiconductor structure;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1B:
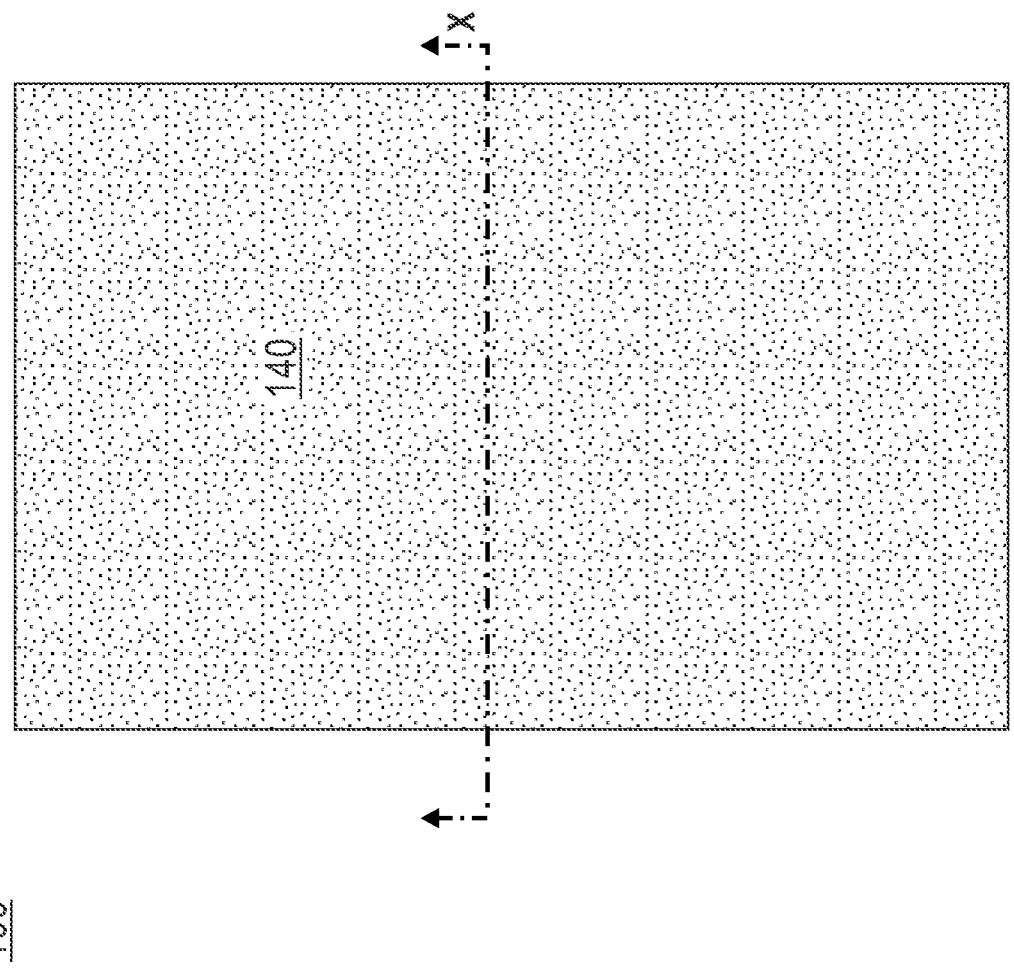
FIG. 1B is a top-down view of the semiconductor structure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Non-planar transistor device architectures such as VFETs, employ semiconductor fins and side-gates that can be contacted outside the active region, resulting in increased device density over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source/drain region is situated in electrical contact with the top and bottom ends of the channel region (i.e., top source/drain region and bottom source/drain region), while a gate is disposed on one or more of the fin sidewalls.

As mentioned above, continued scaling of fin dimensions may present numerous challenges to VFET fabrication. To improve $W_{\mathit{eff}}$ without compromising area scaling, and particularly without increasing cell height, fin structures of different shapes have been considered. Specifically, a C-shaped fin layout may provide an integration-friendly option for enhancing $W_{\mathit{eff}}$ without increasing cell height. However, conventional mandrel cut processes during sidewall image transfer (SIT) can cause $W_{\mathit{eff}}$ variations due to overlay misalignment. Particularly, random variations in cut overlay can cause variations in critical dimension (CD) and N/P ratio that may affect device performance.

Therefore, embodiments of the present disclosure provide a semiconductor structure, and a method of making the same, including a plurality of self-aligned fin structures extending perpendicularly from a semiconductor substrate having a substantially "C" shape that can eliminate $W_{\mathit{eff}}$ variations. The proposed C-shaped fin structures may allow forming a VFET device without mandrel overlay errors that can reduce CD non-uniformity and improve fin width uniformity, among other potential benefits.

Embodiments by which a VFET device with a C-shaped fin arrangement can be formed is described in detailed below by referring to the accompanying drawings in FIGS. 1A-10B.

As used herein, the terms "substantially C-shaped" or "C-shaped" may refer to a shape including two vertical segments (or regions) parallel to each other and having round or curved ends, the two vertical segments being connected or linked on one end by a horizontal segment in the shape of the letter "C".

Figure 1A:
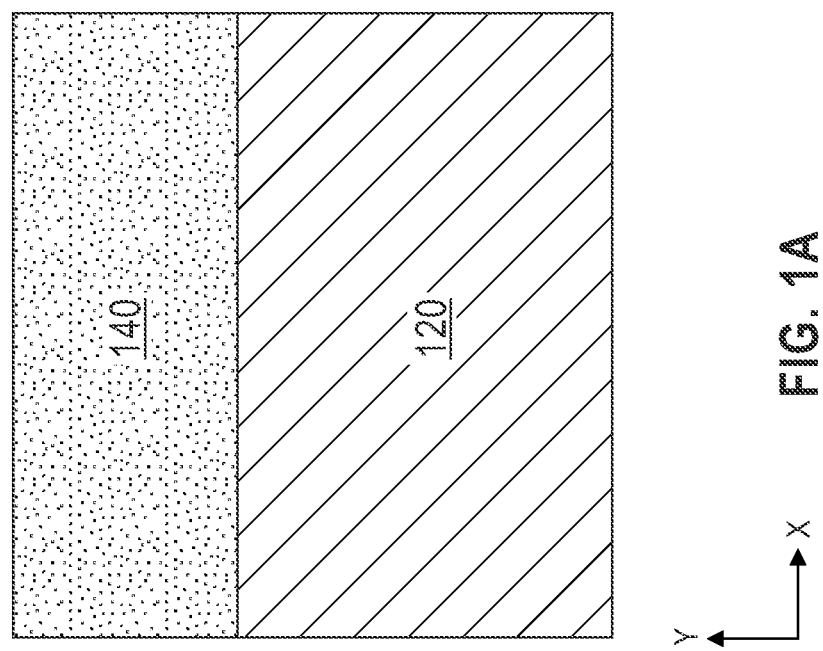
FIG. 1A is a cross-sectional view of a semiconductor structure taken along line X-X at an initial step during a fin patterning process, according to an embodiment of the present disclosure.

Referring now to FIG. 1A, a cross-sectional view of a semiconductor structure 100 taken along line X-X at an initial step during a fin patterning process is shown, according to an embodiment of the present disclosure. In this embodiment, FIG. 1B is a top-down view of the semiconductor structure 100.

Known semiconductor fabrication operations have been used to form the semiconductor structure 100 having a semiconductor substrate 120 and a hardmask layer 140 above the semiconductor substrate 120. It should be noted that the various elements that form the semiconductor structure 100 extend along a first axis (e.g., X-axis) to define width dimensions, and extend along a second axis (e.g., Y-axis) perpendicular to the X-axis to define height (or thickness) dimensions. Although not specifically depicted, the various elements that form the semiconductor structure 100 also extend along a third axis (e.g., Z-axis) perpendicular to the first axis and the second axis to define depth dimensions.

The semiconductor substrate 120 can be any suitable substrate material, such as, for example, monocrystalline silicon (Si), silicon-germanium (SiGe), silicon carbide (SiC), III-V compound semiconductor, II-VI compound semiconductor, or semiconductor-on-insulator (SOI). In some embodiments, the semiconductor substrate 120 includes a buried oxide layer (not depicted). Typically the semiconductor substrate 120 may be about several hundred microns thick. For example, the semiconductor substrate 120 may include a thickness ranging from approximately 0.5 μm to approximately 75 μm.

The hardmask layer 140 can be a dielectric material such as, for example, silicon dioxide, silicon nitride, silicon carbide, or a combination of such materials forming a multiple stack hardmask. The hardmask layer 140 can be deposited by any suitable deposition method known in the art. As known by those skilled in the art, the hardmask layer 140 may also be referred to as a "fin hardmask". A thickness of the hardmask layer 140 may vary from approximately 10 nm to approximately 200 nm and ranges therebetween, although a thickness less than 10 nm and greater than 200 nm may be acceptable.

Referring now to FIG. 2A, a cross-sectional view of the semiconductor structure 100 taken along line X-X is shown after forming an array of mandrels (hereinafter "mandrels") 210, according to an embodiment of the present disclosure. In this embodiment, FIG. 2B is a top-down view of the semiconductor structure 100.

In this embodiment, the mandrels 210 are formed above the hardmask layer 140. For illustration purposes only, without intent of limitation, a limited number of mandrel structures (i.e., mandrels 210) are depicted in the figure, those skilled in the art may know that any number of mandrel structures can be formed in the semiconductor structure 100 to satisfy design requirements.

The mandrels 210 may be made from any of several known semiconductor materials such as, for example, polycrystalline silicon (Si), polycrystalline silicon-germanium (SiGe), and the like. A first semiconductor material (not shown) can be deposited and then patterned to form the mandrels 210. The first semiconductor material forming the mandrels 210 can be deposited by any suitable technique known in the art, for example, by chemical vapor deposition (CVD), atomic layer deposition (ALD), physical vapor deposition (PVD), or plasma enhanced chemical vapor deposition (PECVD). However, it should be noted that other materials may also be used to form the mandrels 210 so long as there is an etch selectivity with respect to subsequently formed sidewall spacers thereon. A shape of the mandrels 210 may have nearly vertical etch slopes or nearly vertical contact angles.

The first semiconductor material is then lithographically patterned to form the mandrels 210. As known by those skilled in the art, patterning of the first semiconductor material to form the mandrels 210 involves exposing a photo-resist (not shown) and transferring the exposed pattern of the photo-resist to the first semiconductor material. After patterning, a width of the resulting mandrels 210 may vary from approximately 10 nm to approximately 100 nm and ranges therebetween, although a width less than 10 nm and greater than 100 nm may be acceptable.

Various regions of different polarity are depicted in FIG. 2B. For illustration purposes only, without intent of limitation, the semiconductor structure 100 as depicted in FIG. 2B may include a first PFET region, a second PFET region adjacent to the first PFET region and separated from the first PFET region by a first space (i.e., p2p space), and an NFET region adjacent to the second PFET region and separated from the second PFET region by a second space (i.e., n2p space). As illustrated in FIG. 2B, a row of mandrels 210 is formed on each of the first PFET region, second PFET region, and NFET region. It should be noted that other configurations can be achieved on the semiconductor structure 100 to satisfy design requirements.

Figure 3B:
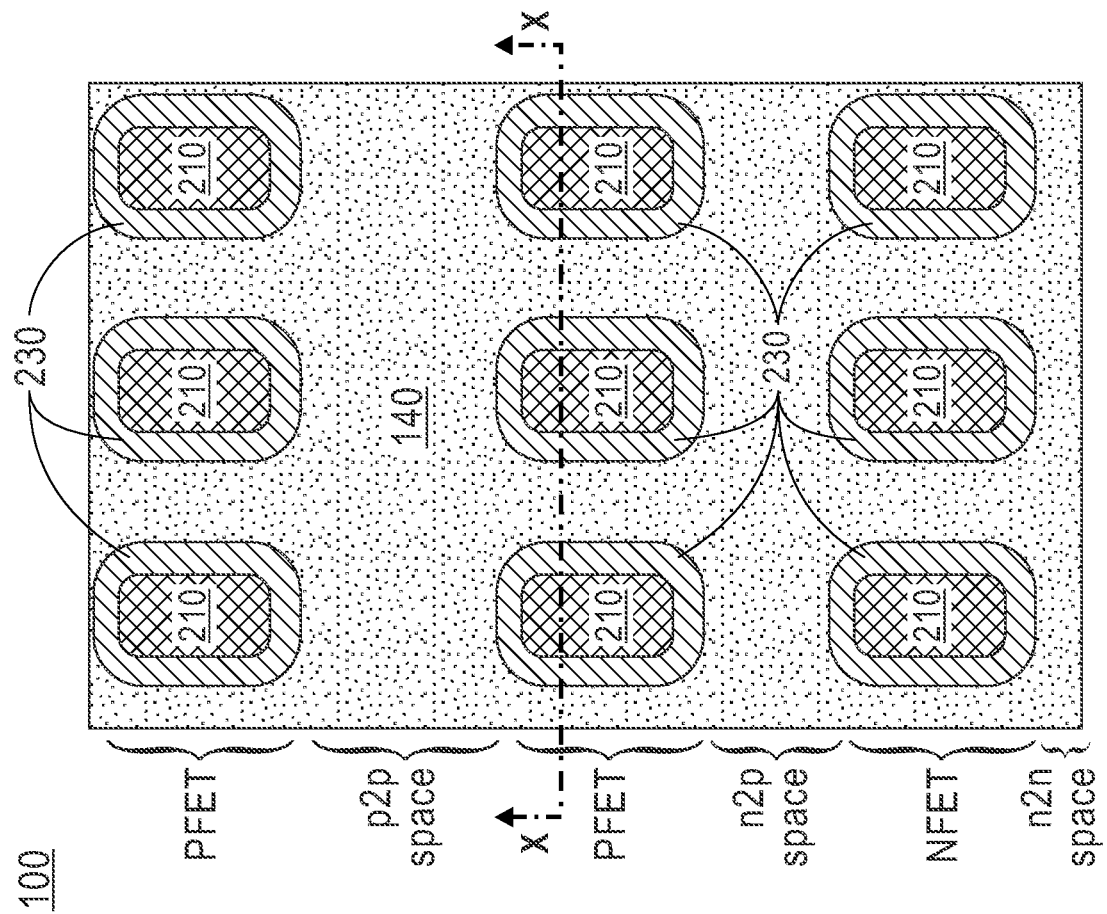
FIG. 3B is a top-down view of the semiconductor structure.
Figure 3A:
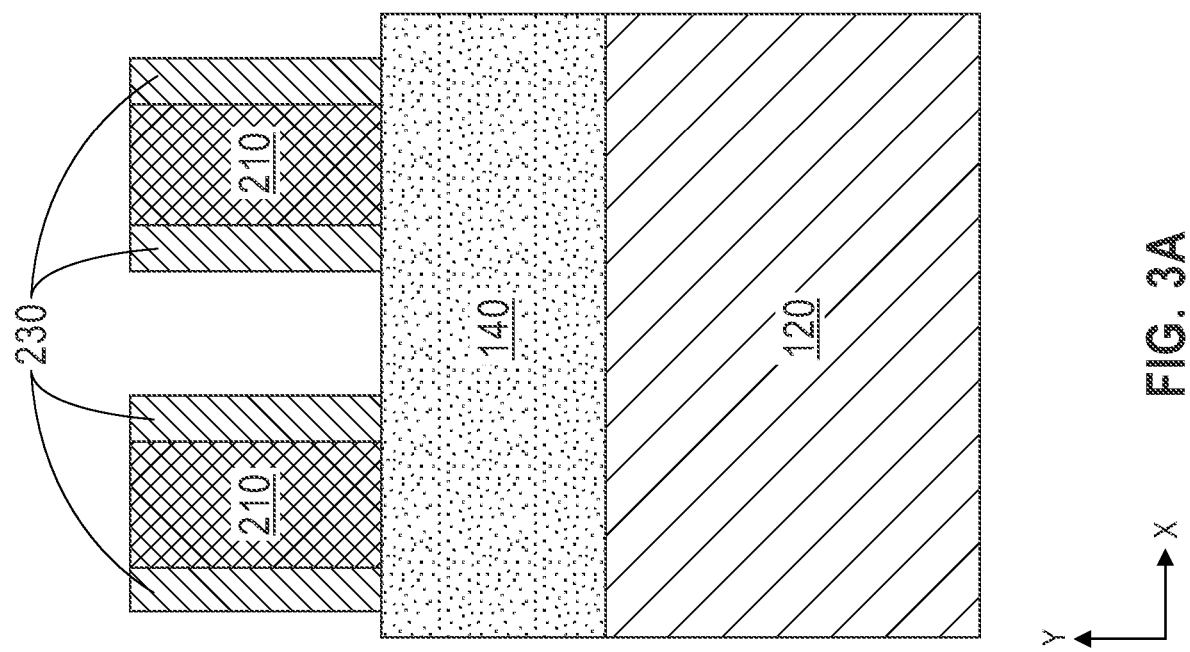
FIG. 3A is a cross-sectional view of the semiconductor structure taken along line X-X after forming sidewall image transfer spacers, according to an embodiment of the present disclosure.

Referring now to FIG. 3A, a cross-sectional view of the semiconductor structure 100 taken along line X-X is shown after forming sidewall image transfer (SIT) spacers 230, according to an embodiment of the present disclosure. In this embodiment, FIG. 3B is a top-down view of the semiconductor structure 100.

After forming the mandrels 210, a layer of dielectric material (not shown) can be conformally deposited on the semiconductor structure 100. A directional etching process such as a reactive-ion-etching (RIE) can be conducted on the semiconductor structure 100 to remove portions of the dielectric material from top surfaces of the hardmask layer 140 and mandrels 210. As illustrated in the figure, after the etching process remaining portions of the dielectric material surround the mandrels 210 forming the SIT spacers 230.

Etching generally refers to the removal of a material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. RIE operates under conditions intermediate between sputter and plasma etching and may be used to produce deep, narrow features, such as shallow trench isolation (STI) trenches.

It should be noted that each of the mandrels 210 and SIT spacers 230 include materials that allow the mandrels 210 to be removed selective to the SIT spacers 230. The SIT spacers 230 will subsequently define a fin pattern which ultimately may be transferred into the underlying semiconductor substrate 120, as will be described in detail below.

Any suitable dielectric material can be used to form the SIT spacers 230. For example, a suitable dielectric material for forming the SIT spacers 230 may include silicon dioxide ($SiO_2$), oxygen-doped silicon carbide (SiCO), or similar dielectric materials. As mentioned above, the dielectric material forming the SIT spacers 230 should include a material that allows the mandrels 210 to be selectively etched in order to avoid erosion of the SIT spacers 230. The dielectric material forming the SIT spacers 230 can be deposited using conformal deposition techniques such as, for example, ALD, or any other suitable deposition technique. According to an embodiment, the SIT spacers 230 may have width varying from approximately 5 nm to approximately 50 nm.

Referring now to FIG. 4A, a cross-sectional view of the semiconductor structure 100 taken along line X-X is shown after depositing a conformal oxide layer (hereinafter "oxide layer") 310 is shown, according to an embodiment of the present disclosure. In this embodiment, FIG. 3B is a top-down view of the semiconductor structure 100.

According to an embodiment, the oxide layer 310 includes an oxide semiconductor material such as titanium oxide (TiOx). The oxide layer 310 is formed to pinch-off narrow open spaces between mandrels 210 located within the NFET or PFET regions, and wider spaces located between the p2p or n2p spaces that may not be pinched-off yet. In an exemplary embodiment, the oxide layer 310 can be formed by an atomic layer deposition (ALD) process.

Referring now to FIG. 5A, a cross-sectional view of the semiconductor structure 100 taken along line X-X is shown after etching the oxide layer 310 to expose top portions of the mandrels 210 and SIT spacers 230, according to an embodiment of the present disclosure. In this embodiment, FIG. 3B is a top-down view of the semiconductor structure 100.

An isotropic etch is performed on the semiconductor structure 100 to recess the oxide layer 310 and expose a top portion of the mandrels 210 and a top portion of the SIT spacers 230, as depicted in FIG. 5A. Further, as can be observed in FIG. 5B, lateral or side portions of the SIT spacers 230 facing a space between regions are also expose during the etching process. Specifically, in the exemplary embodiment of FIG. 5B, lateral portions of the SIT spacers 230 facing the p2p, n2p and n2n spaces are exposed during the isotropic etch process.

As known by those skilled in the art, isotropic etching includes all etching processes with equal etch rates for all spatial directions. Isotropic etch processes are rate controlled either by transport processes with direction-independent transport rate (most frequent case of isotropic etching) or by surface processes in the case of removing completely isotropic built materials. Isotropic etching includes wet chemical processes as well as dry etching processes. For example, a wet SC1 etch, can be conducted to expose top and lateral portions of the SIT spacers 230.

Figure 6B:
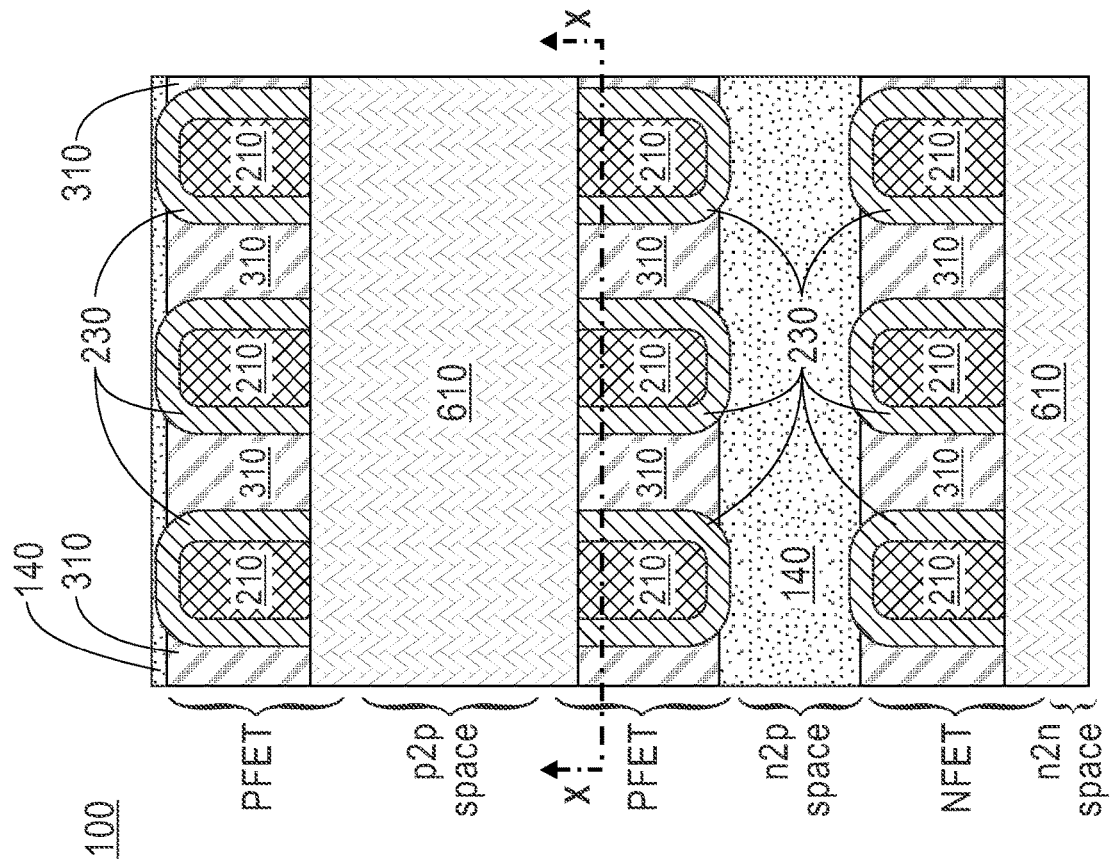
FIG. 6B is a top-down view of the semiconductor structure.
Figure 6A:
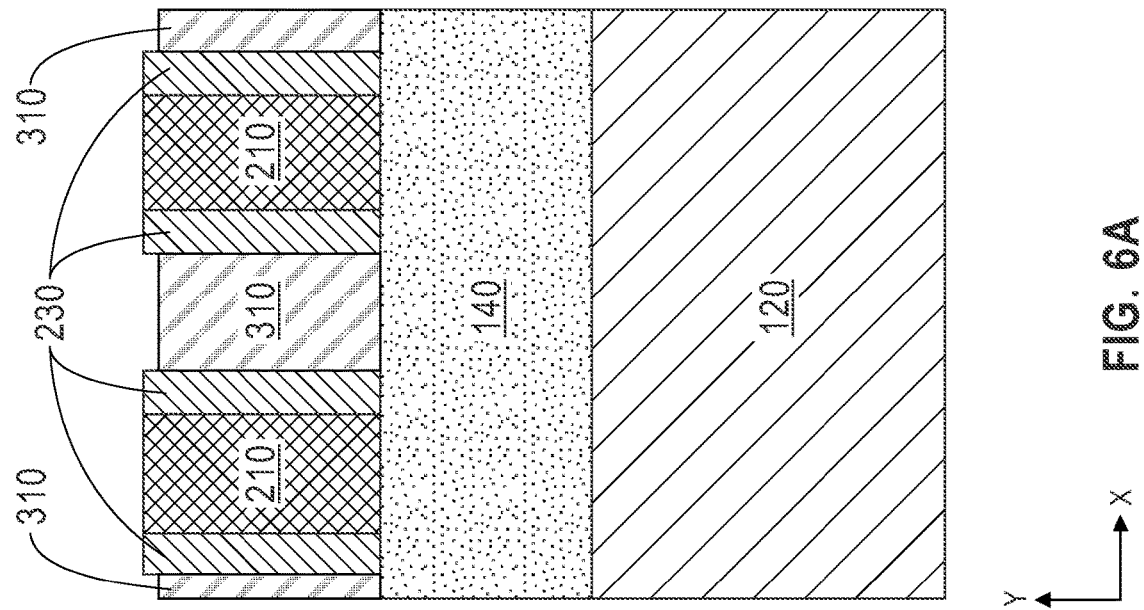
FIG. 6A is a cross-sectional view of the semiconductor structure taken along line X-X after forming an organic planarization layer, according to an embodiment of the present disclosure.

Referring now to FIG. 6A, a cross-sectional view of the semiconductor structure 100 taken along line X-X is shown after forming a soft mask 610 to protect the n2n and p2p regions while opening the n2p space for a subsequent etch process, according to an embodiment of the present disclosure. In this embodiment, FIG. 6B is a top-down view of the semiconductor structure 100.

According to an embodiment, the soft mask 610 can be an organic planarization layer (OPL) that is formed on the semiconductor structure 100 to cover a space between regions of the same polarity. for example, as shown in FIG. 6b, the soft mask 610 substantially covers the p2p space between the first PFET region and the second PFET region and the n2n space between the NFET region and a contiguous or adjacent NFET region (not shown). As may be observed, the n2p space between the second PFET region and the NFET region remains open. thus, the space between regions of different polarity is not covered by the soft mask 610. Forming the soft mask 610, as depicted in FIG. 6b, allows etching the exposed lateral portions of the SIT spacers 230 on the uncovered regions (i.e., regions not covered by the soft mask 610), as will be described in detail below.

The soft mask 610 can be made of any organic planarizing material that is capable of effectively preventing damage of underlying layers during subsequent etching processes. The soft mask 610 can include, but is not necessarily limited to, an organic polymer including C, H, and N. According to an embodiment, the OPL material can be free of silicon (Si). According to another embodiment, the OPL material can be free of Si and fluorine (F). As defined herein, a material is free of an atomic element when the level of the atomic element in the material is at or below a trace level detectable with analytic methods available in the art. Non-limiting examples of the OPL material forming the soft mask 610 can include JSR HM8006, JSR HM8014, AZ UM10M2, Shin Etsu ODL 102, or other similar commercially available materials. The soft mask 610 may be deposited by, for example, spin coating followed by a planarization process, such as CMP.

With continued reference to FIGS. 6A-6B, a lithography process followed by an etching process is conducted on the semiconductor structure 100 for etching the soft mask 610 and exposing the space between regions of different polarity (e.g., the n2p space between the second PFET region and the NFET region), as shown in the figure. In some embodiments, etching the soft mask 610 can be conducted by, for example, an OPL RIE including a trace point detection.

Figure 7B:
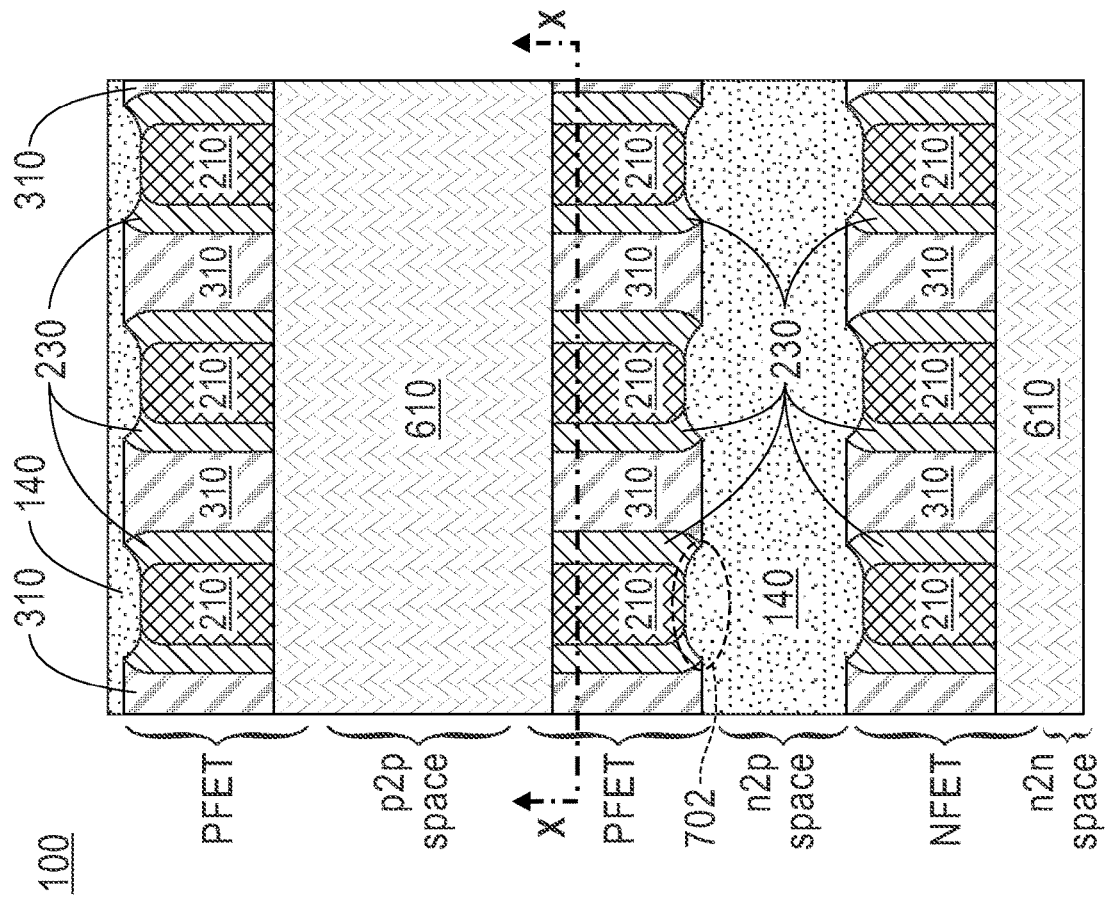
FIG. 7B is a top-down view of the semiconductor structure.
Figure 7A:
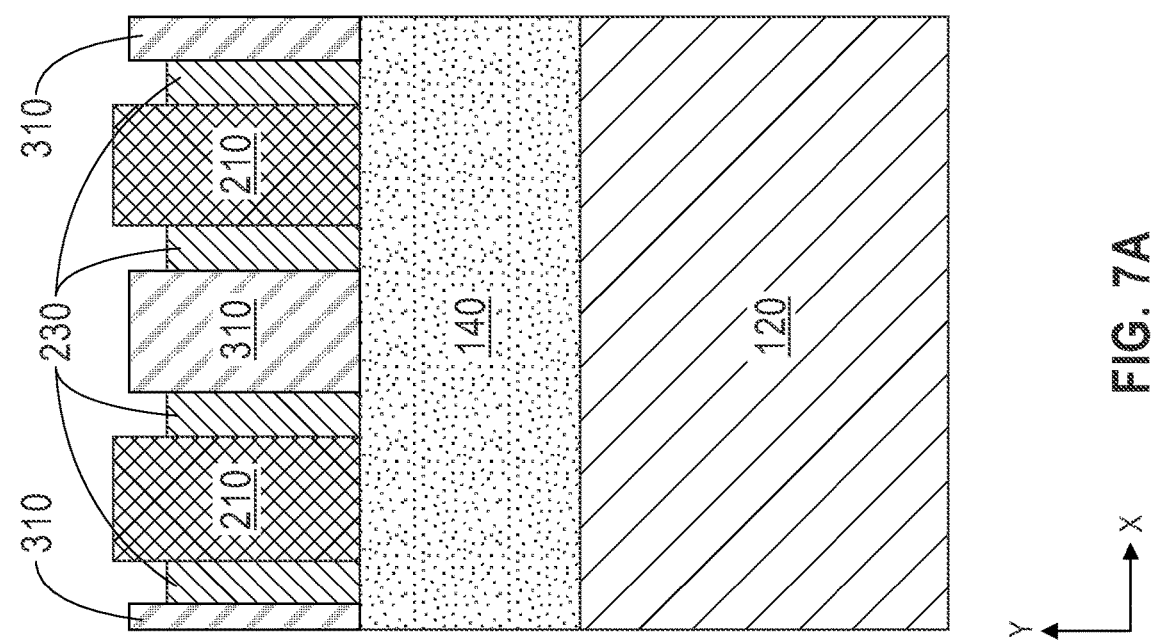
FIG. 7A is a cross-sectional view of the semiconductor structure taken along line X-X after removing exposed portions of the sidewall image transfer spacers, according to an embodiment of the present disclosure.

Referring now to FIG. 7A, a cross-sectional view of the semiconductor structure 100 taken along line X-X is shown after removing exposed portions of the SIT spacers 230, according to an embodiment of the present disclosure. In this embodiment, FIG. 7B is a top-down view of the semiconductor structure 100.

Any suitable isotropic etch process can be conducted to remove the exposed portions of the SIT spacers 230 including, for example, DHF, SiConi oxide etch. As described above, during isotropic etching, the material forming the SIT spacers 230 is removed at the same rate in all directions (lateral and vertical), this may cause an end of the SIT spacers 230 to have a round shape 702 having a substantially curved or bend section without sharp angles, as depicted in FIG. 7B.

Figure 8B:
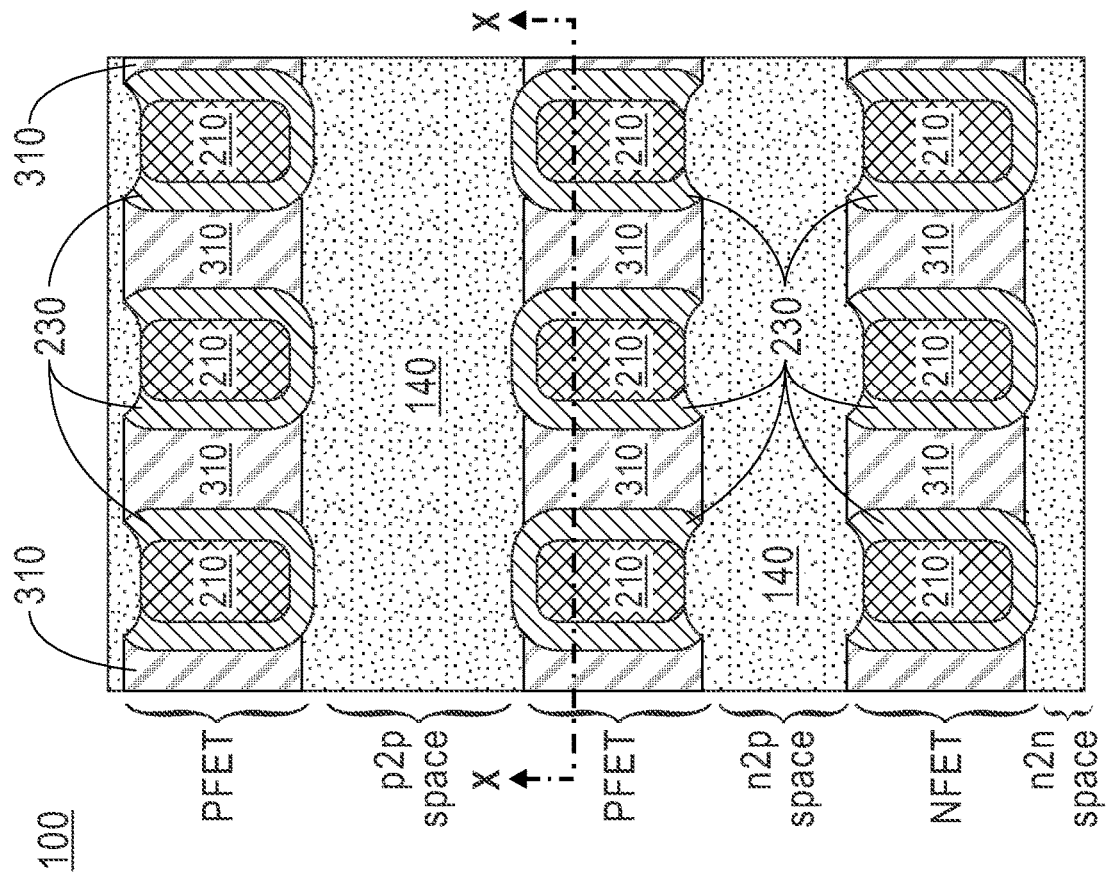
FIG. 8B is a top-down view of the semiconductor structure.
Figure 8A:
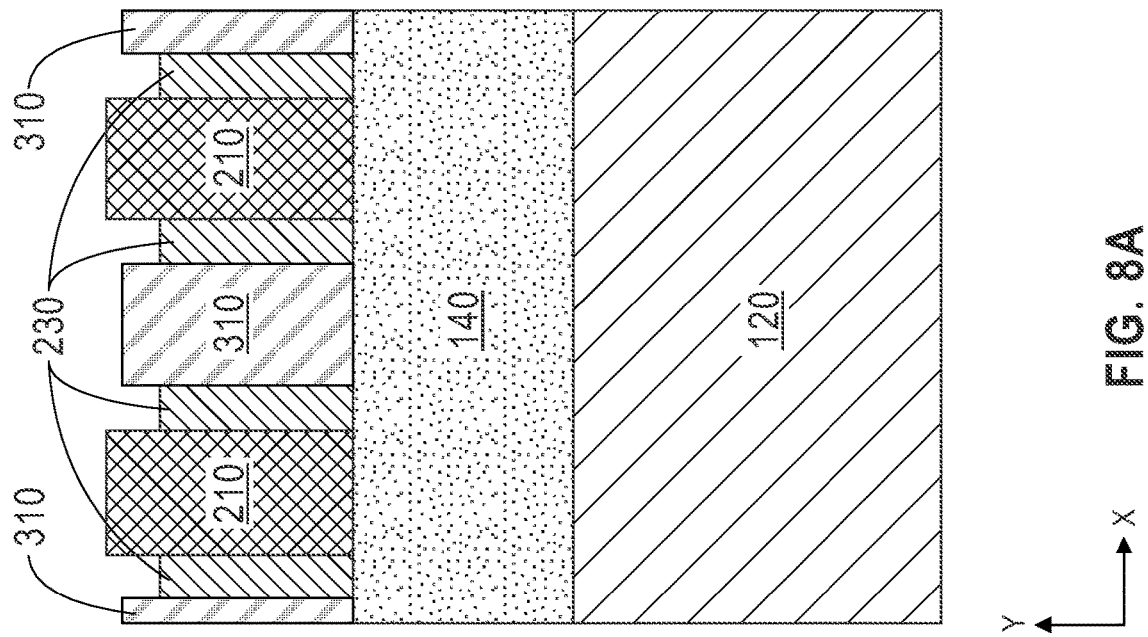
FIG. 8A is a cross-sectional view of the semiconductor structure taken along line X-X after removing the organic planarization layer, according to an embodiment of the present disclosure.

Referring now to FIG. 8A, a cross-sectional view of the semiconductor structure 100 taken along line X-X is shown after removing the soft mask 610, according to an embodiment of the present disclosure. In this embodiment, FIG. 8B is a top-down view of the semiconductor structure 100.

Exemplary techniques suitable for removing the soft mask 610 (FIGS. 7A-7B) from the semiconductor structure 100 may include, but are not limited to, oxygen plasma, nitrogen plasma, hydrogen plasma or other carbon strip or ashing process, which causes minimal or no damage to the underlying layers.

Referring now to FIG. 9A, a cross-sectional view of the semiconductor structure 100 taken along line X-X is shown after removing the mandrels 210 and the oxide layer 310, according to an embodiment of the present disclosure. In this embodiment, FIG. 9B is a top-down view of the semiconductor structure 100.

At this step of the manufacturing process, the mandrels 210 and the oxide layer 310 are removed selective to the SIT spacers 230, as depicted in the figure. Removal of the mandrels 210 and oxide layer 310 should not compromise the integrity of the SIT spacers 230. In an embodiment, the mandrels 210 may be removed using standard cleaning techniques including, for example, ammonium hydroxide, hydrogen peroxide, hot ammonia, etc. Similarly, the sacrificial oxide layer 310 can be removed by SC1, in which the SIT spacers 230 are not trimmed.

As known by those skilled in the art, the SIT spacers 230 can now be used as a hard mask such that an anisotropic etching process can be used to transfer a fin pattern 902 defined by the SIT spacers 230 to the underlying dielectric layer (i.e., the hardmask layer 140), as will be described in detail below. As can be observed in FIG. 9B, the fin pattern 902 includes a first vertical segment 902a and a second vertical segment 902b parallel to the first vertical segment 902a. End portions of the first vertical segment 902a and the second vertical segment 902b have a round shape. The fin pattern 902 further includes a third horizontal segment 902c extending between and connecting the first vertical segment 902a and the second vertical segment 902b in a way such that the fin pattern 902 substantially resembles the letter "C". Accordingly, an end of the first vertical segment 902a and the second vertical segment 902b opposing to the third horizontal segment 902c remains open (i.e., opening 902d).

It should be noted that, the etching step conducted on the SIT spacers 230 described above with reference to FIGS. 7A-7B, defines a location of the opening 902d in the fin pattern 902. Thus, a location of the opening 902d depends on the polarity of the region in which the fin structure will be located.

Figure 10B:
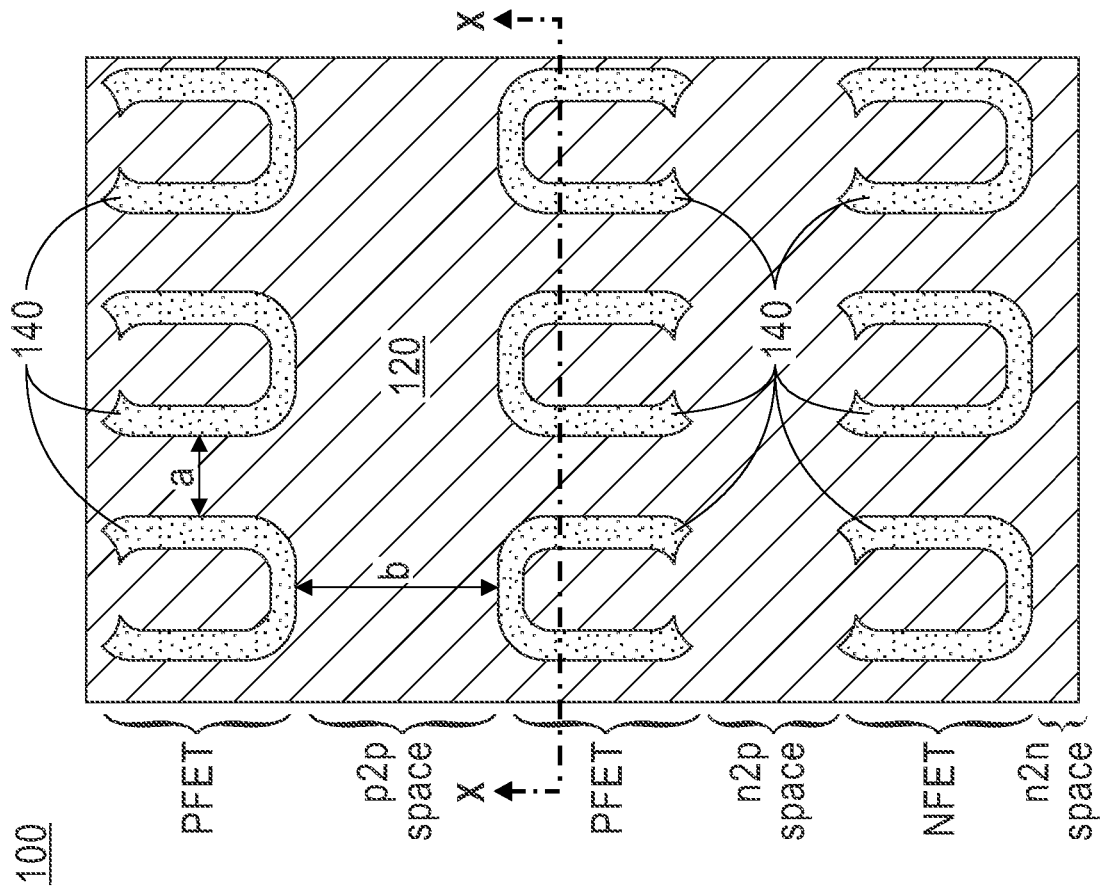
FIG. 10B is a top-down view of the semiconductor structure.
Figure 10A:
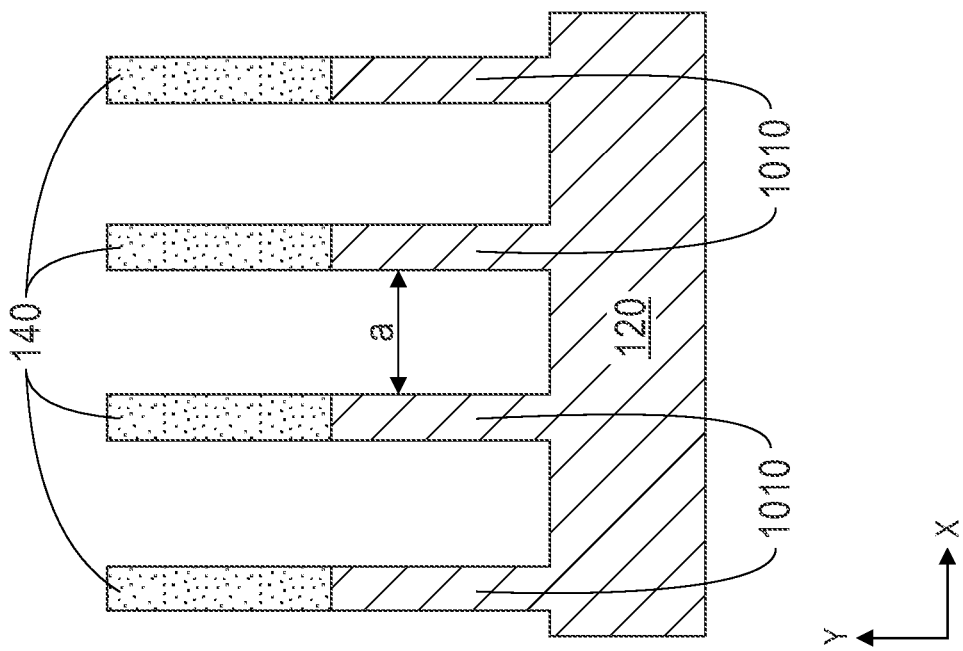
FIG. 10A is a cross-sectional view of the semiconductor structure taken along line X-X after transferring a fin pattern defined by the sidewall image transfer spacers to the hardmask layer, according to an embodiment of the present disclosure.

Referring now to FIG. 10A, a cross-sectional view of the semiconductor structure 100 taken along line X-X is shown after transferring the fin pattern 902 defined by the SIT spacers 230 to the hardmask layer 140 and forming a plurality of fin structures (hereinafter "fin structures") 1010, according to an embodiment of the present disclosure. In this embodiment, FIG. 10B is a top-down view of the semiconductor structure 100.

An anisotropic etching process can be conducted on the semiconductor structure 100 to transfer the fin pattern 902 (FIG. 9B) defined by the SIT spacers 230 (FIG. 9B) to the underlying hardmask layer 140, as illustrated in the figures. Suitable anisotropic etch processes include, for example, RIE. As may be understood, the SIT spacers 230 (FIG. 9B) define the C-shaped fin pattern 902 (FIG. 9B) that is transferred to the hardmask layer 140, and ultimately to the semiconductor substrate 120 to form the fin structures 1010. A depth of the anisotropic etching process may depend on the ultimate function of the semiconductor structure 100. In some embodiments, a portion of the hardmask layer 140 may remain on top of the fin structures 1010, as depicted in the figures.

The resulting fin structures 1010 extend perpendicularly from an upper surface of the semiconductor substrate 120. As depicted in FIG. 10B, each fin structure 1010 includes two adjacent vertical segments with rounded ends extending perpendicularly from the uppermost surface of the semiconductor substrate and a horizontal segment extending between and connecting the two adjacent vertical segments, with an opening located between the two adjacent vertical segments on a side of the fin structure 1010 opposing the horizontal segment formed according the fin pattern 902 (FIG. 9B).

Accordingly, the fin structures 1010 formed from the fin pattern 902 (FIG. 9B) has a C-shaped fin architecture that provides a flexible VFET design for simultaneously forming a combination of fin structures 1010 that can facilitate cell height scaling and improve $W_{\it eff}$ without affecting device performance or violating design rules. It should be noted that any number of (C-shaped) fin structures 1010 can be formed in the semiconductor structure 100, as required for satisfying a specific device design.

Further, as depicted in FIG. 10B, embodiments of the present disclosure provides a semiconductor structure 100 in which a distance "a" between neighboring fin structures 1010 is substantially smaller than a distance "b" between rows of fin structures 1010 which is fundamental for proper device performance. Accordingly, embodiments of the present disclosure improves the SIT process by eliminating mandrel cut variations that can otherwise cause detrimental CD and N/P ratio variations.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate+/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
    a semiconductor substrate having an uppermost surface; and
    a fin structure on the uppermost surface of the semiconductor substrate, the fin structure including two adjacent vertical segments with rounded ends extending perpendicularly from the uppermost surface of the semiconductor substrate and a horizontal segment extending between and connecting the two adjacent vertical segments, wherein an opening is located between the two adjacent vertical segments on a side of the fin structure opposing the horizontal segment.

2. The semiconductor structure of claim 1, wherein the two adjacent vertical segments connected by the horizontal segment and having the opening on the side of the fin structure opposing the horizontal segment defines a C-shaped fin architecture in the semiconductor structure.

3. The semiconductor structure of claim 1, further comprising:
    a first region having a first polarity, the first region comprising a first row of fin structures; and
    a second region adjacent to the first region, the second region having a second polarity and comprising a second row of fin structures, wherein the first polarity and the second polarity are equal.

4. The semiconductor structure of claim 3, wherein the horizontal segment of each fin structure in the first row of fin structures faces the horizontal segment of each fin structure in the second row of fin structures.

5. The semiconductor structure of claim 3, further comprising:
    a third region adjacent to the second region, the third region having a third polarity and comprising a third row of fin structures, wherein the third polarity is different from the first polarity and the second polarity.

6. The semiconductor structure of claim 5, wherein the opening of each fin structure in the second row of fin structures faces the opening of each fin structure in the second row of fin structures.

7. The semiconductor structure of claim 5, wherein neighboring fin structures in the first row of fin structures, neighboring fin structures in the second row of fin structures, and neighboring fin structures in the third row of fin structures are each separated by a first distance a, and wherein the first row of fin structures, the second row of fin structures, and the third row of fin structures are each separated by a second distance b, the first distance a being smaller than the second distance b.

8. A semiconductor structure comprising:
    a semiconductor substrate;
    a first region and a second region on the semiconductor substrate, the first region being adjacent to the second region and separated from the second region by a first space, the first region and the second region having a first polarity;
    a third region on the semiconductor substrate adjacent to the second region and separated from the second region by a second space, the third region having a second polarity that is different from the first polarity; and
    a row of fin structures disposed on each of the first region, the second region and the third region, each fin structure in the row of fin structures including two adjacent vertical segments with rounded ends extending perpendicularly from an uppermost surface of the semiconductor substrate and a horizontal segment extending between and connecting the two adjacent vertical segments, wherein an opening is located between the two adjacent vertical segments on a side of the fin structure opposing the horizontal segment.

9. The semiconductor structure of claim 8, wherein the horizontal segment of each fin structure in the row of fin structures disposed on the first region faces the horizontal segment of each fin structure in the row of fin structures disposed on the second region.

10. The semiconductor structure of claim 8, wherein the opening of each fin structure in the row of fin structures disposed on the second region faces the opening of each fin structure in the row of fin structures disposed on the third region.

11. The semiconductor structure of claim 8, wherein a fin structure in the row of fin structures is separated from another fin structure in the same row of fin structures by a first distance a, wherein the first distance a is smaller than a second distance b separating each row of fin structures.

12. A method of forming a semiconductor structure, comprising:
    forming a plurality of fin structures on an uppermost surface of a semiconductor substrate, each fin structure in the plurality of fin structures comprising:
        two adjacent vertical segments with rounded ends extending perpendicularly from the uppermost surface of the semiconductor substrate, and
        a horizontal segment extending between and connecting the two adjacent vertical segments, wherein an opening is located between the two adjacent vertical segments on a side of each fin structure opposing the horizontal segment.

13. The method of claim 12, wherein forming the plurality of fin structures further comprises:
    forming a hardmask layer on the semiconductor substrate;
    transferring a fin pattern to the hardmask layer defining the plurality of fin structures; and
    forming the plurality of fin structures on the uppermost surface of the semiconductor substrate according to the transferred fin pattern.

14. The method of claim 12, wherein the two adjacent vertical segments connected by the horizontal segment and having the opening on the side of each fin structure opposing the horizontal segment defines a C-shaped fin architecture in the semiconductor structure.

15. The method of claim 13, wherein transferring the fin pattern further comprising:
    forming an array of mandrels on the hardmask layer;
    forming sidewall image transfer spacers surrounding the array of mandrels;
    forming a oxide layer above the hardmask layer, the array of mandrels and the sidewall image transfer spacers; and etching the oxide layer to expose top and lateral portions of the sidewall image transfer spacers.

16. The method of claim 15, further comprising:
depositing an organic planarization layer; and
patterning the organic planarization layer to cover a space between regions of the semiconductor substrate having the same polarity and exposing a space between regions of the semiconductor substrate having opposing polarities.

17. The method of claim 16, further comprising:
removing portions of the sidewall image transfer spacers not covered by the organic planarization layer using an isotropic etch process; and
removing the organic planarization layer.

18. The method of claim 17, further comprising:
removing the array of mandrels selective to the sidewall image transfer spacers.

19. The method of claim 12, wherein the horizontal segment of a fin structure disposed on a first region faces the horizontal segment of a fin structure disposed on a second region when the first region and the second region have the same polarity.

20. The method of claim 19, wherein the opening of a fin structure disposed on the first region faces the opening of a fin structure disposed on the second region when the first region and the second region have different polarities.

* * * * *